(12) United States Patent
Jain et al.

(10) Patent No.: US 11,811,342 B2
(45) Date of Patent: Nov. 7, 2023

(54) RIPPLE COUNTER WITH DYNAMIC BANDPASS FILTER FOR DC MOTOR

(71) Applicant: Texas Instruments Incorporated, Dallas, TX (US)

(72) Inventors: Chinmay Jain, Bangalore (IN); Kalpana Suryawanshi, Bangalore (IN); Priyank Anand, Bangalore (IN); Ashish Ojha, Bangalore (IN); Krishnamurthy Shankar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 523 days.

(21) Appl. No.: 17/101,861

(22) Filed: Nov. 23, 2020

(65) Prior Publication Data
US 2022/0166357 A1 May 26, 2022

(51) Int. Cl.
*H05B 41/282* (2006.01)
*H02P 23/14* (2006.01)
(Continued)

(52) U.S. Cl.
CPC .............. *H02P 23/14* (2013.01); *G06F 1/04* (2013.01); *H03H 17/02* (2013.01); *H03K 5/24* (2013.01); *H03M 1/12* (2013.01)

(58) Field of Classification Search
CPC ... H05B 41/2828; G01L 1/2256; H02P 23/14; G06F 1/04; H03H 17/02; H03K 5/24; H03M 1/12
See application file for complete search history.

(56) References Cited

U.S. PATENT DOCUMENTS

2006/0226793 A1* 10/2006 Matsuura ........... H05B 41/2828
315/307
2009/0205436 A1* 8/2009 Garverick ............. G01L 1/2256
73/777
(Continued)

FOREIGN PATENT DOCUMENTS

CN 109975705 A 7/2019
JP 2004080921 A 3/2004

OTHER PUBLICATIONS

International Search Report for PCT/US2021/059324 dated Mar. 3, 2022, 2 pgs.

*Primary Examiner* — Cortez M Cook
(74) *Attorney, Agent, or Firm* — Valerie M. Davis; Frank D. Cimino

(57) ABSTRACT

Disclosed is a ripple counter with a dynamic bandpass filter for a DC motor. The ripple counter includes a current sense amplifier configured to provide an analog voltage responsive to an inline current in rotor windings of the DC motor. The ripple counter also includes an analog-to-digital converter configured to provide a digital signal responsive to the analog voltage. The ripple counter also includes a digital filter configured to receive the digital signal and a clock signal and configured to vary a frequency response to provide a filtered ripple current. The ripple counter also includes a digital comparator circuit configured to receive the filtered ripple current and to provide a pulsed output. The ripple counter also includes a clock generator configured to detect the frequency of the pulsed output and to provide the clock signal responsive to the detected frequency.

14 Claims, 5 Drawing Sheets

(51) Int. Cl.
*H03H 17/02* (2006.01)
*G06F 1/04* (2006.01)
*H03K 5/24* (2006.01)
*H03M 1/12* (2006.01)

(56) References Cited

U.S. PATENT DOCUMENTS

2013/0099718 A1  4/2013  Bruhn et al.
2020/0186062 A1  6/2020  Fancellu et al.

* cited by examiner

| CATEGORY CLK# | RIPPLE FREQUENCY (Hz) | | COUNTER (NUMBER) | | FilterCLK (Hz) |
|---|---|---|---|---|---|
| | MinInput | MaxInput | MinValue | MaxValue | |
| 0 | 39 | 78 | 640,000 | 320,000 | 625 |
| 1 | 79 | 156 | 319,999 | 160,000 | 1.25k |
| 2 | 157 | 312 | 159,999 | 80,000 | 2.5k |
| 3 | 313 | 625 | 79,999 | 40,000 | 5k |
| 4 | 626 | 1250 | 39,999 | 20,000 | 10k |
| 5 | 1251 | 2500 | 19,999 | 10,000 | 20k |
| 6 | 2501 | 5000 | 9,999 | 5,000 | 40k |
| 7 | 5001 | 10000 | 4,999 | 2,500 | 80k |

RIPPLE COUNTER WITH DYNAMIC BANDPASS FILTER FOR DC MOTOR

FIELD OF THE INVENTION

The present invention relates to electric motors, and more particularly, to a ripple counter with a dynamic bandpass filter for DC motors.

RELATED ART

A DC motor is a rotary electrical motor that converts direct current electrical energy into mechanical energy. Large DC motors are used in elevators, hoists, automotive systems and industrial drives in steel mills. Small DC motors are used in power tools, appliances, robots and toys.

In many brushed DC motor applications, e.g., automotive actuator systems, it is essential to keep track of the motor rotations in order to implement precise motion control. Traditionally, Hall effect sensors or optical sensors with photodiodes have been used to keep track of the motor rotations. The traditional sensors typically generate pulses responsive to the rotating motor shaft and feed signal to a motor controller. The sensors require PCB mount for installation inside and outside the motor and require connectors and cables to feed signal to the motor controller. Thus, the traditional sensors add complexity and cost in brushed DC motor applications.

SUMMARY

An aspect of the present invention involves a ripple counter. The ripple counter includes a current sense amplifier having an input and an output. The ripple counter is configured to provide an analog voltage at the output responsive to an inline current in rotor windings of a DC motor. The ripple counter also includes an analog-to-digital converter (ADC) having an input coupled to the output of the current sense amplifier and having an output. The ADC is configured to provide a digital signal responsive to the analog voltage. The ripple counter also includes a digital filter having a first input coupled to the output of the ADC, a second input and an output. The digital filter is configured to receive the digital signal at the first input and a clock signal at the second input and is configured to vary a frequency response to provide a filtered ripple current at the output. The ripple counter also includes a digital comparator circuit having an input coupled to the output of the digital filter and is configured to receive the filtered ripple current at the input. The digital comparator is configured to provide a pulsed signal at an output. The ripple counter also includes a clock generator having an input coupled to the output of the digital comparator circuit and is configured to detect the frequency of the pulsed output and to provide the clock signal responsive to the detected frequency.

In another aspect, the frequency of the pulsed output corresponds to ripples in the filtered ripple current. In another aspect, the clock generator is configured to vary the frequency of the clock signal responsive to the pulsed output. In another aspect, the digital filter is a bandpass filter tuned to remove lower frequency components and higher frequency noise and to allow ripple current to escape. In another aspect, the digital comparator circuit is configured to provide the pulsed output based on a comparison of the filtered ripple current and one or more threshold values.

Another aspect of the present invention involves a DC motor control system. The system includes a DC motor having rotor windings arranged to provide a conduction path for an inline current. The system also includes a current sense amplifier configured to provide an analog voltage responsive to the inline current. The system also includes an analog-to-digital converter (ADC) configured to provide a digital signal responsive to the analog voltage. The system also includes a digital filter configured to receive the digital signal and a clock signal. The digital filter is configured to vary a frequency response to provide a filtered ripple current. The system also includes a digital comparator circuit configured to receive the filtered ripple current and to provide a pulsed output. The system also includes a clock generator configured to detect the frequency of the pulsed output and to provide the clock signal responsive to the detected frequency.

In another aspect, the rotor windings are coupled to commutator segments which are electrically coupled via brushes to a DC voltage supply, wherein commutation spikes are generated from contacts by the brushes with the commutator segments, and wherein ripples are formed in the inline current due to the commutation spikes.

Another aspect of the present invention involves a control system comprising a DC motor having rotor windings coupled to commutator segments arranged on a rotor. The commutator segments are electrically coupled via brushes to a DC voltage supply to provide a conduction path for an inline current in the rotor windings. The system includes a current sense amplifier configured to provide an analog voltage responsive to the inline current and an analog-to-digital converter (ADC) configured to provide a digital signal responsive to the analog voltage. The system also includes a digital filter configured to receive the digital signal and a clock signal. The digital filter is configured to vary a frequency response to provide a filtered ripple current. The system also includes a digital comparator circuit configured to receive the filtered ripple current and to provide a pulsed output. The system also includes a clock generator configured to detect the frequency of the pulsed output and to provide the clock signal responsive to the detected frequency.

DETAILED DESCRIPTION

Figure 1:
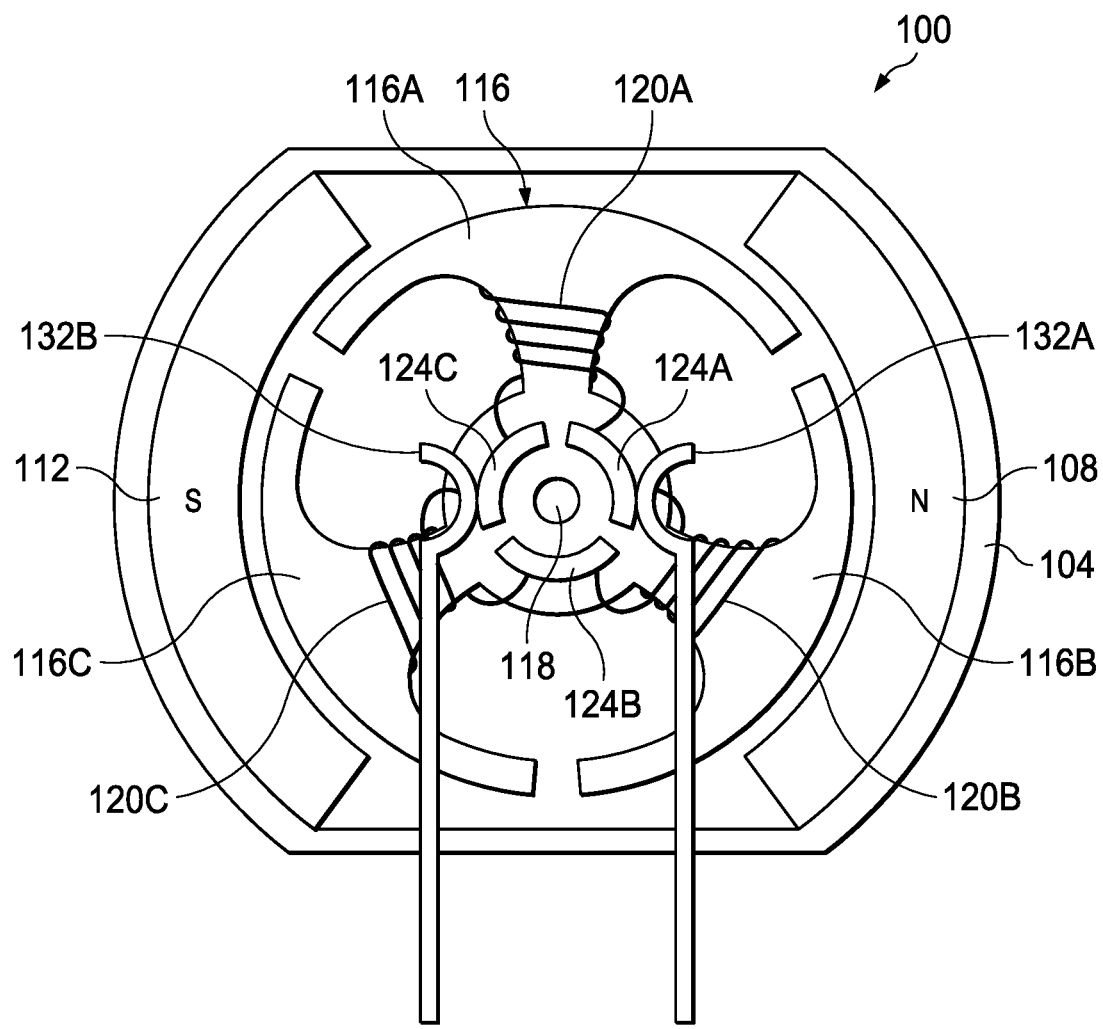
FIG. 1 illustrates an exemplary DC motor according to the disclosure.

FIG. 1 illustrates an exemplary DC motor 100 according to the disclosure. The DC motor 100 has a stator 104 which holds two permanent magnets 108 and 112. The permanent magnets 108 and 112 form north and south poles. The DC motor 100 also has a rotor 116 coupled to a shaft 118. The rotor 116 has three T-shaped rotor arms 116A, 116B and 116C. The rotor arms 116A, 116B and 116C each have respective rotor windings 120A, 120B and 120C wrapped around the rotor arms.

With continuing reference to FIG. 1, the DC motor 100 also includes commutator segments 124A, 124B and 124C arranged concentrically around the shaft 118. The commutator segments 124A, 124B and 124C are separated and electrically isolated from each other. The rotor windings 120A, 120B and 126C are connected to the commutator segments 124A, 124B and 124C such that each rotor winding connects to a different commutator segment. The commutator segments 124A, 124B and 124C sit between two brushes 132A and 132B which are electrically connected to a DC voltage supply (not shown in FIG. 1). The brushes rub 132A and 132B against the commutator segments 124A, 124B and 124C to complete the circuit.

In operation, when the DC motor 100 rotates, commutation spikes are generated every time the brushes 132A and 132B move from one commutator segment to the following. The commutation spikes are electrical current spikes caused due to the quick discharge of the magnetic field stored in the rotor windings when the brushes 132A and 132B break contact with the commutator segments 124A, 124B and 124C. The commutation spikes cause ripple current which is a low amplitude alternating current riding on the DC current. The ripple current has a periodic variation corresponding to the rotor movement as the rotor windings 120A, 120B and 120C connect and disconnect to the DC voltage supply via the brushes 132A and 132B.

In one aspect of the disclosure, the commutation spikes are used to measure the speed and to determine the position of the motor. In the exemplary embodiment of FIG. 1, six commutation spikes per revolution are generated. Knowing the frequency of the commutation spikes (Fs) and the number of poles (P) of the DC motor 100, the motor speed is calculated as:

$$Speed = 60 \times Fs \times P$$

Figure 2:
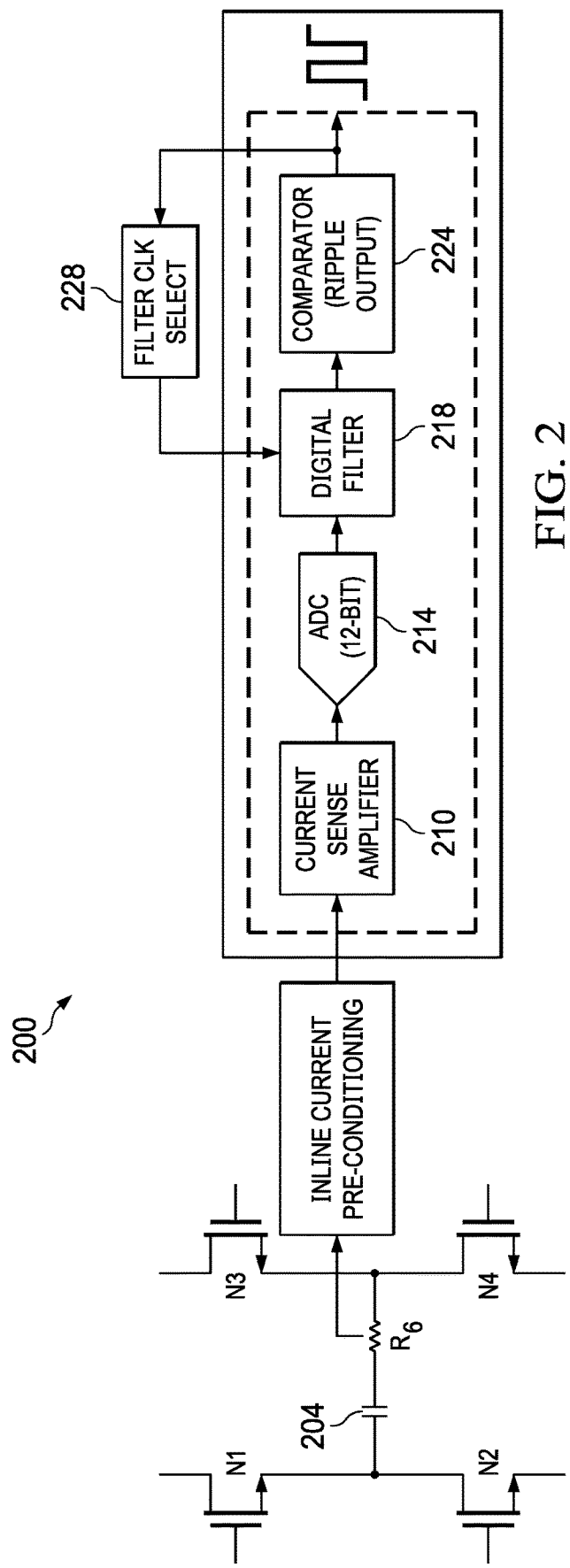
FIG. 2 illustrates a ripple counter according to the disclosure.

In another aspect of the disclosure, a ripple counter having a dynamic bandpass filter is used to count the commutation spikes (i.e., ripples) in order to measure the speed and to determine the position of the DC motor. FIG. 2 illustrates an exemplary ripple counter 200 according to the disclosure. The ripple counter 200 is configured to count the commutation spikes (i.e., ripples). The ripple counter 200 features a dynamic bandpass filter tuned to remove low frequency components and high frequency non ripple components and to allow ripple current to escape. The filtered ripple current is compared with one or more threshold values to determine start, peak and end of the commutation spikes.

With reference to FIG. 2, the ripple counter 200 is configured to sense inline current (also referred to as motor current) in a DC motor 204 driven by a bridge driver comprising transistors N1, N2, N3 and N4. A resistor $R_s$ having a very low resistance is in series with the DC motor 204, thus allowing inline current to conduct through the resistor $R_s$.

With continuing reference to FIG. 2, the ripple counter 200 includes a current sense amplifier 210 which measures the inline current in the resistor $R_s$. The current sense amplifier 210 provides an analog voltage which is representative of the inline current.

The ripple counter 200 also includes an analog-to-digital converter (ADC) 214 coupled to receive the analog voltage. The ADC 214 can be, for example, a 12 bit ADC configured to provide a digital signal which is a digital representation of the analog voltage.

With continuing reference to FIG. 2, the ripple counter 200 also includes a digital filter 218 coupled to receive the digital signal and a clock signal. The digital filter 218 is a bandpass filter having a frequency response which is controlled by varying the frequency of the clock signal. Thus, the passband of the digital filter 218 can be tuned by selecting an appropriate clock frequency. The digital filter 218 provides a filtered ripple current. The passband of the digital filter 218 is selected to remove low frequency components and high frequency noise and thus allowing the filtered ripple current to escape.

The ripple counter 200 also includes a digital comparator circuit 224 configured to receive the filtered ripple current. The digital comparator circuit 224 provides a pulsed output by comparing the filtered ripple current with one or more threshold values. For example, the pulsed output may be generated by comparing the filtered ripple current with one or more threshold values. The pulsed output is representative of the commutation spikes (i.e., ripples).

With continuing reference to FIG. 2, the ripple counter 200 also includes a clock generator 228 coupled to receive the pulsed output. The clock generator 228 is configured to determine the frequency of the pulsed output and to provide the clock signal responsive to the determined frequency. The clock generator 228 may, for example, count the frequency of the pulsed output using a high frequency clock (e.g., 25 MHz clock). The frequency of the clock signal varies depending on the pulsed output. The clock signal is applied to the digital filter 218 which results in an appropriate passband based on the clock frequency. Thus, the clock generator 228 forms a feedback loop by varying the frequency of the clock signal based on the pulsed output and applying the clock signal to the digital filter 218 in order to vary the passband. Consider, for example, the load on the DC motor 204 is changed or the DC motor 204 is braked. Consequently, the commutation spikes (i.e., ripples) also change, which causes the pulsed output and the clock frequency to vary. The passband is varied based on the frequency of the ripples. The pulsed output signal acts as a feedback signal which controls the passband of the digital filter 218.

Figures 3, 4:
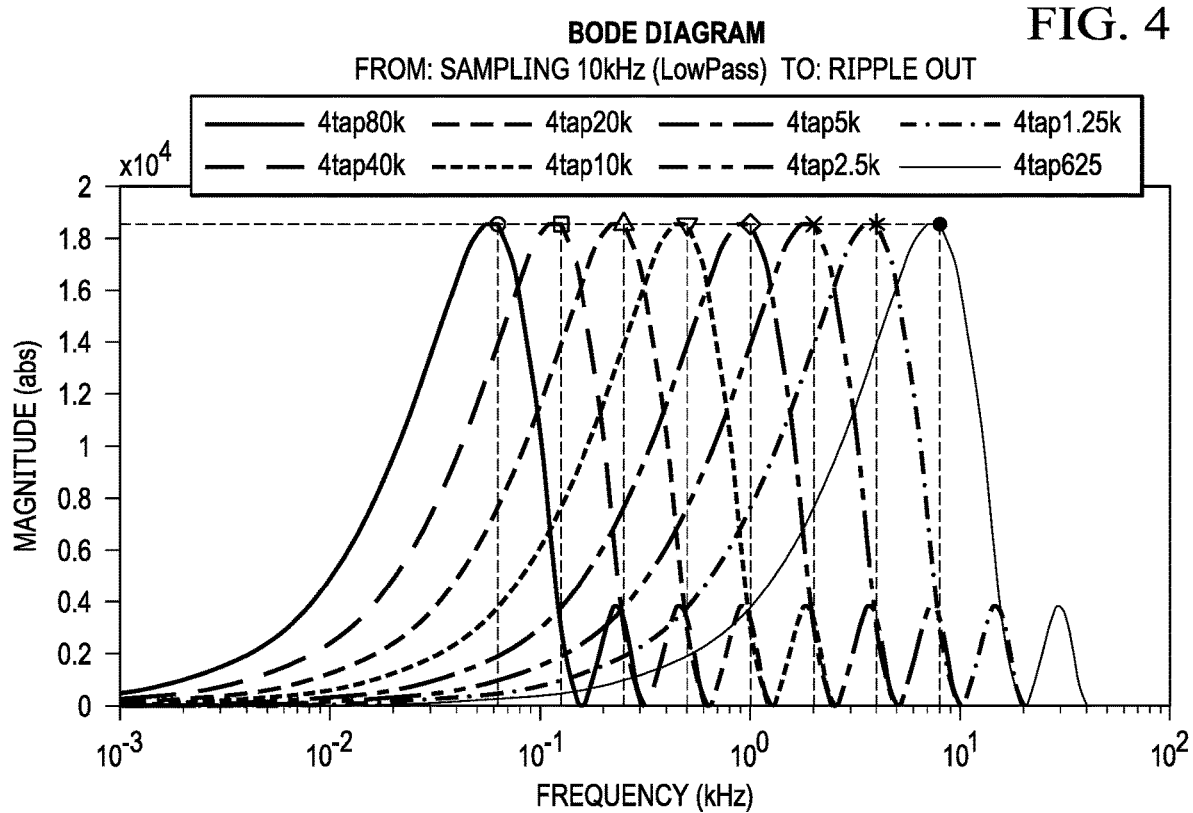
FIG. 3 illustrates a table for selection of clock frequencies.
FIG. 4 illustrates exemplary Bode plots of bandpass filters according to the disclosure.

In an exemplary embodiment, the clock generator 228 may select the clock frequency using a look-up table shown in FIG. 3. By way of example, if the ripple frequency is between 39 Hz-78 Hz, which corresponds to a counter value between 320K-640K, the selected clock frequency is 625 Hz. If the ripple frequency is between 626 Hz-1250 Hz, which corresponds to a counter value between 20K-39.99K, the selected clock frequency is 5 KHz. The clock frequency is used to tune the passband of the digital filter 218. FIG. 4 illustrates exemplary Bode plots of bandpass filters corresponding to selected clock frequencies in FIG. 3.

Figure 5:
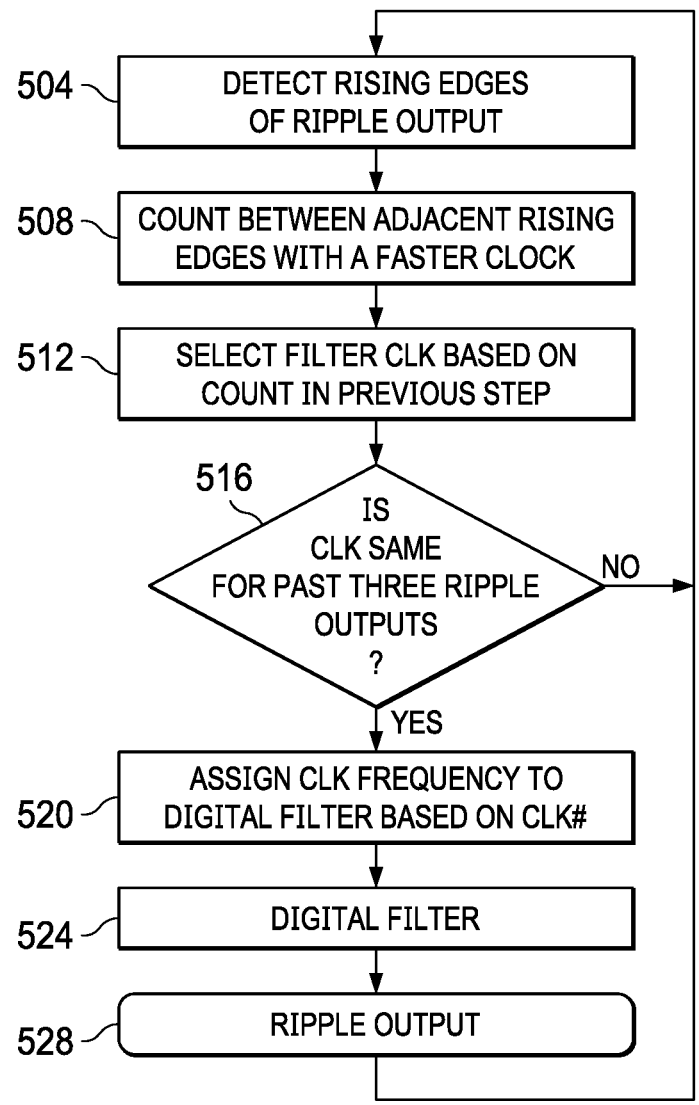
FIG. 5 is a state diagram of an exemplary process according to the disclosure.

FIG. 5 is a block diagram of an exemplary process 500 for counting ripples according to the disclosure. The process 500 may be executed by a finite state machine or by one or more processors.

In a block 504, rising edges of the pulsed output, which are representative of the ripples, are detected. In a block 508, the frequency of the pulsed output is determined based on counts between adjacent rising edges of the pulsed output. In a block 512, the frequency of the clock signal is selected based on the counts. In a block 516, a determination is made if the count (i.e., frequency of the pulsed output) has changed in previous N pulsed outputs. If the count has not changed in the previous N pulsed outputs, the flow returns to the block 504. If the count has changed in the previous N pulsed outputs, in a block 520 the clock generator circuit selects a new clock frequency based on the changed count. Thus, N acts as a buffer which prevents modification of the clock frequency due to spurious ripples. In an exemplary embodiment, N=3, but other suitable values of N may be selected.

In a block 524, the digital filter selects a passband based on the new clock frequency and provides the filtered ripple current. In a block 528, the digital comparator circuit generates the pulsed output by comparing the filtered ripple current with the threshold values.

In an exemplary embodiment, a DC motor control system includes a DC motor having rotor windings arranged to provide a conduction path for an inline current. The rotor windings are coupled to commutator segments which are electrically coupled via brushes to a DC voltage supply. When the brushes make contact with the commutator segments, commutation spikes are generated causing ripples in the inline current. The control system also includes a current sense amplifier configured to provide an analog voltage responsive to the inline current. The control system also includes an analog-to-digital converter (ADC) configured to provide a digital signal responsive to the analog voltage. The control system also includes a digital filter configured to receive the digital signal and a clock signal. The digital filter is configured to vary a frequency response to provide a filtered ripple current. The control system also includes a digital comparator circuit configured to receive the filtered ripple current and to provide a pulsed output. The control system also includes a clock generator configured to detect the frequency of the pulsed output and to provide the clock signal responsive to the detected frequency.

In an exemplary embodiment of the disclosure, one or more components of the ripple counter 200 may comprise machine readable instructions that are encoded within one or more non-transitory memory devices and executed on one or more processors that perform their respective described functions. As used herein, "non-transitory memory" may refer to any tangible storage medium and refer to the medium itself, and not to a limitation on data storage (e.g., RAM vs. ROM). For example, non-transitory medium may refer to an embedded volatile memory encoded with instructions whereby the memory may have to be re-loaded with the appropriate machine-readable instructions after being power cycled. Alternatively, or in combination, one or more of the components of the ripple counter 200 may be implemented in Field Programmable Gate Arrays (FPGAs), Application-Specific Integrated Circuits (ASICs), dedicated circuitry, and/or software stored as machine readable instructions that are executed on one or more processors. It will be understood that such variations are possible and within the scope of the disclosure.

Figure 6:
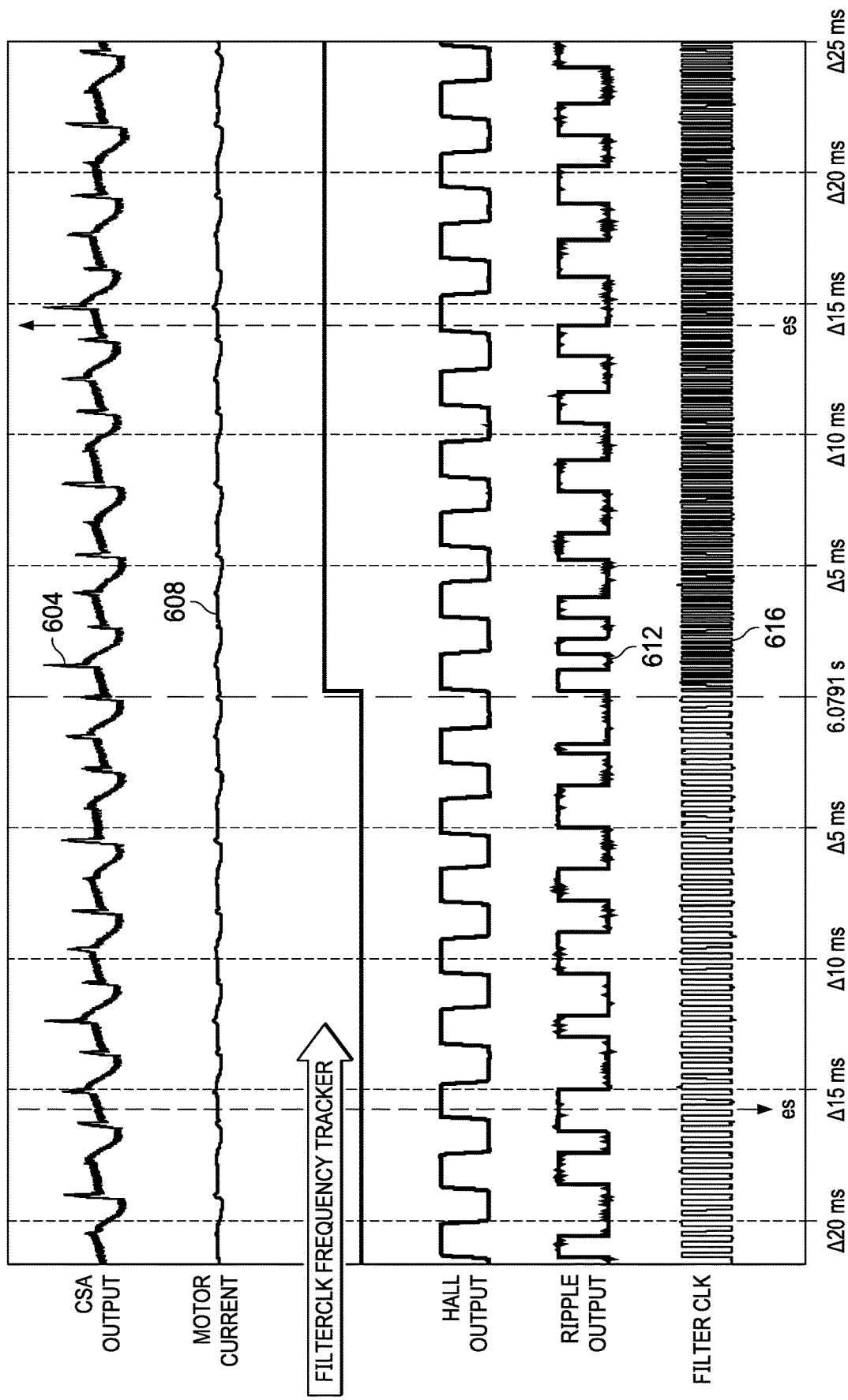
FIG. 6 illustrates waveforms generated by a ripple counter according to the disclosure.

FIG. 6 illustrates waveforms generated by the ripple counter 200 and the DC motor 204. The current sense amplifier provides an analog voltage 604 responsive to an inline current 608. The digital comparator circuit provides a pulsed output 612 which is representative of the ripples. The pulsed output 612 is applied to the clock generator circuit which selects a clock signal 616 based on the pulsed output 612. As the pulsed output 612 varies, the frequency of the clock signal 616 varies.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A ripple counter, comprising:
   a current sense amplifier having an input and an output;
   an analog-to-digital converter (ADC) having an input coupled to the output of the current sense amplifier and an output;
   a digital filter having a first input coupled to the output of the ADC, a second input and an output;
   a digital comparator circuit having an input coupled to the output of the digital filter and an output; and
   a clock generator having an input coupled to the output of the digital comparator circuit and an output coupled to the second input of the digital filter.

2. The ripple counter of claim 1, wherein the digital filter is a bandpass filter.

3. The ripple counter of claim 1, wherein the digital filter has a passband controlled by the frequency of the clock signal.

4. The ripple counter of claim 1, wherein the current sense amplifier is electrically coupled to a DC motor.

5. A DC motor control system, comprising:
   a DC motor having rotor windings;
   a current sense amplifier having an input electrically coupled to the rotor windings and an output;
   an analog-to-digital converter (ADC) having an input coupled to the output of the current sense amplifier and an output;
   a digital filter having a first input coupled to the output of the ADC, a second input and an output;
   a digital comparator circuit having an input coupled to the output of the digital filter and an output; and
   a clock generator having an input coupled to the output of the digital comparator circuit and an output coupled to the second input of the digital filter.

6. The DC motor control system of claim 5, wherein the rotor windings are coupled to commutator segments which are electrically coupled via brushes to a DC voltage supply.

7. The DC motor control system of claim 5, wherein the digital filter is a bandpass filter.

8. The DC motor control system of claim 5, wherein the digital filter has a passband controlled by the frequency of the clock signal.

9. A DC motor control system, comprising:
   a DC motor having rotor windings coupled to commutator segments arranged on a rotor, wherein the commutator segments are electrically coupled via brushes to a DC voltage supply;
   a current sense amplifier having an input electrically coupled to the rotor windings and having an output;
   an analog-to-digital converter (ADC) having an input coupled to the output of the current sense amplifier and an output;
   a digital filter having a first input coupled to the output of the ADC, a second input and an output;
   a digital comparator circuit having an input coupled to the output of the digital filter and an output; and
   a clock generator having an input coupled to the output of the digital comparator circuit and an output coupled to the second input of the digital filter.

10. The DC motor control system of claim 9, wherein the digital filter is a bandpass filter.

11. The DC motor control system of claim 9, wherein the digital filter has a passband controlled by the frequency of the clock signal.

12. A ripple counter, comprising:
- an analog-to-digital converter having an input and an output;
- a digital bandpass filter having a first input coupled to the output of the ADC, a second input and an output;
- a digital comparator circuit having an input coupled to the output of the digital filter and an output; and
- a clock generator having an input coupled to the output of the digital comparator circuit and an output coupled to the second input of the digital filter.

13. The ripple counter of claim 12, further comprising a current sense amplifier having an input electrically coupled to a DC motor and an output coupled to the input of the ADC.

14. The ripple counter of claim 12, wherein the digital bandpass filter has a passband controlled by the frequency of the clock signal.

* * * * *